(12) United States Patent
Liu

(10) Patent No.: US 7,628,669 B2
(45) Date of Patent: Dec. 8, 2009

(54) ORGANIC LIGHT EMITTING DEVICES WITH CONDUCTIVE LAYERS HAVING ADJUSTABLE WORK FUNCTION AND FABRICATION METHODS THEREOF

(75) Inventor: Tswen-Hsin Liu, Jhudong Township, Hsinchu County (TW)

(73) Assignee: Au Optronics Corp., Hsinchu (TW)

( * ) Notice: Subject to any disclaimer, the term of this patent is extended or adjusted under 35 U.S.C. 154(b) by 467 days.

(21) Appl. No.: 11/086,099

(22) Filed: Mar. 22, 2005

(65) Prior Publication Data

US 2006/0138940 A1 Jun. 29, 2006

(30) Foreign Application Priority Data

Dec. 23, 2004 (TW) .............................. 93140225 A

(51) Int. Cl.
*H01J 9/02* (2006.01)
*H05B 33/10* (2006.01)
*B05D 5/12* (2006.01)

(52) U.S. Cl. .......................... 445/46; 445/24; 313/504; 427/66

(58) Field of Classification Search ................. 313/504, 313/506; 427/66, 535; 257/79; 445/46, 445/24
See application file for complete search history.

(56) References Cited

U.S. PATENT DOCUMENTS

| | | |
|---|---|---|
| 6,259,202 B1 | 7/2001 | Sturm et al. ................. 313/504 |
| 2001/0015463 A1* | 8/2001 | Wakabayashi et al. ...... 257/371 |
| 2004/0108507 A1* | 6/2004 | Grushin et al. ................ 257/79 |
| 2004/0146744 A1* | 7/2004 | Seo et al. ..................... 428/690 |
| 2006/0209529 A1* | 9/2006 | Son et al. ...................... 362/84 |
| 2007/0080342 A1* | 4/2007 | Bold et al. ..................... 257/40 |

* cited by examiner

*Primary Examiner*—Karabi Guharay
(74) *Attorney, Agent, or Firm*—Thomas, Kayden, Horstemeyer & Risley

(57) ABSTRACT

A method of modifying a work function of a conductor surface for use in organic light emitting devices. A plasma treatment is performed on the conductive layer. The plasma treatment employs a mixing gas comprising a nitrogen-containing gas for decreasing the work function and an oxygen-containing gas for increasing the work function. A flow ratio of the nitrogen-containing gas to the oxygen-containing gas is controlled to modify the work function.

20 Claims, 5 Drawing Sheets

ORGANIC LIGHT EMITTING DEVICES WITH CONDUCTIVE LAYERS HAVING ADJUSTABLE WORK FUNCTION AND FABRICATION METHODS THEREOF

BACKGROUND

The invention relates to organic light emitting devices, and more particularly, to enhancing optoelectronic performance by plasma treatment of conductive layers utilized in organic light emitting devices.

Organic light emitting devices (OLEDs) employ organic thin film materials which emit light when excited by electric current. These devices typically consist of a sandwich structure with organic thin films deposited onto a transparent substrate and covered by top metal cathode contacts. A layer of transparent and conductive material is interposed between the transparent substrate and the organic thin films to serve as an anode.

The organic thin films typically consist of an emission layer between an electron transport layer and a hole transport layer. When current is applied between the cathode and anode, the emission layer provides a recombination region for electrons injected from the electron transport layer and holes from the hole transport layer. This recombination results in the emission of light having a characteristic wavelength dependent on the organic materials used. Alternatively, single-layer organic or blended organic layers can be used instead of multilayer organic thin films.

Due to its transparency, high conductivity and work function as a hole injector into organic materials, indium-tin-oxide (ITO) is widely used as the anode material for OLEDs. Since the hole transport layer is in direct contact with the ITO in OLEDs, the surface work function of the ITO is expected to approach that of the hole transport layer, enhancing device performance. Consequently, a plasma treatment is performed to modify the surface work function of the ITO prior to formation of the hole transport layer thereon.

U.S. Pat. No. 6,259,202 to Sturm et al., the entirety of which is hereby incorporated by reference, discloses a method for modifying a work function of an ITO layer, comprising subjecting the ITO layer to an oxygen plasma treatment and a hydrogen plasma treatment. Oxygen plasma tends to increase ITO work function and hydrogen plasma tends to decrease ITO work function.

The conventional techniques, however, employ a dangerous hydrogen gas, which posed serious threat to worker safety. Additionally, the conventional techniques do not teach how to precisely match the surface work function of the ITO with that of the adjacent hole transport layer.

SUMMARY

Methods of modifying a work function of a conductor surface are provided. In an exemplary embodiment of modifying a work function of a conductor surface, a plasma treatment is performed on the conductive layer. The plasma treatment employs a mixing gas comprising a first reactive gas for decreasing the work function and a second reactive gas for increasing the work function. A flow ratio of the first reactive gas to the second reactive gas is controlled to modify the work function of treated anode material.

Organic light emitting devices (OLEDS) and fabrication methods are provided. In an exemplary embodiment of forming an OLED, an indium-containing oxide layer with a work function is provided. A plasma treatment is performed on the indium-containing oxide layer to modify the work function, so that a surface of the indium-containing oxide layer comprises a modified work function. An organic layer is formed on the indium-containing oxide layer, wherein the organic layer comprises a hole transport layer with a HOMO (highest occupied molecular orbital) level adjacent to the indium-containing oxide layer. A conductive layer is formed on the organic layer. The plasma treatment employs a mixing gas comprising a nitrogen-containing gas for decreasing the work function and an oxygen-containing gas for increasing the work function. A flow ratio of the nitrogen-containing gas to the oxygen-containing gas is controlled to make the modified work function equal or approximate to the HOMO energy level.

The indium-containing oxide layer with a work function is treated with a plasma treatment. The plasma treatment employs a mixing gas comprising a nitrogen-containing gas for decreasing the work function and an oxygen-containing gas for increasing the work function. The surface work function of the indium-containing oxide layer can thus be modified to precisely match the HOMO energy level of the adjacent hole transport layer by controlling a flow ratio of nitrogen-containing gas to oxygen-containing gas, improving device performance and worker safety.

DESCRIPTION OF THE DRAWINGS

The invention will become more fully understood from the detailed description given in the following and the accompanying drawings, given by way of illustration only and thus not intended to be limitative, and wherein.

DETAILED DESCRIPTION

Figure 1:
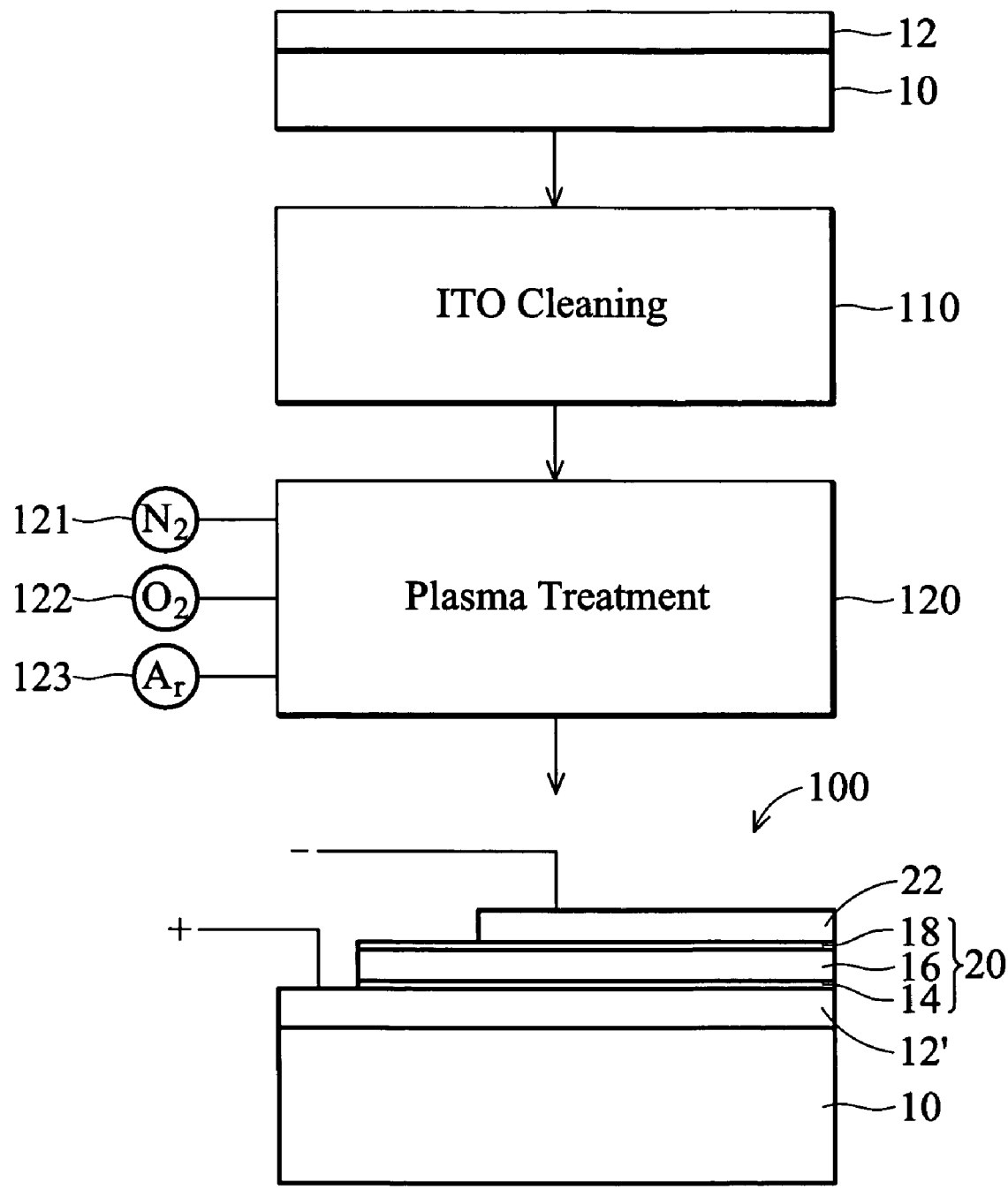
FIG. 1 is a schematic flowchart showing an embodiment of a manufacturing process of an embodiment of an OLED.

Methods of modifying the surface work function of conductive layers are provided. The conductive layers can be used in electrical devices, such as OLEDs or others. An exemplary embodiment of a manufacturing process of an embodiment of an OLED is shown in FIG. 1. A representative OLED is illustrated, but is not intended to limit the disclosure.

In FIG. 1, a conductive layer 12 serving as an anode is formed on a substrate 10. The conductive layer 12 may includes a metal or an alloy. Typically, the conductive layer 12 could be a transparent conductive layer, such as an indium-containing oxide layer. The indium-containing oxide may be indium-tin-oxide (ITO) or indium-zinc-oxide (IZO) formed by evaporation and deposition. ITO/IZO is the preferred material for transparent anodes. The substrate 10 can be a glass or plastic substrate. For convenience, the representative ITO layer 12 is illustrated in the following description.

After formation of the ITO layer 12, the ITO layer 12 is cleaned by a conventional wet cleaning step 110 using detergents, water or solvents as is known in the art. A photoemission spectroscopy (e.g. model: AC-2 made by Japan Riken) then measures the cleaned ITO layer 12 and shows the ITO work function to be about 4.9 eV.

A plasma treatment 120 is then performed on the ITO layer 12 to modify the ITO work function. A modified ITO layer 12' is thus obtained and the surface thereof comprises a modified ITO work function. The plasma treatment 12 employs a mixing gas comprising at least a first reactive gas 121 and a second reactive gas 122. The first reactive gas 121 is employed to decrease the work function of the ITO layer 12. The second reactive gas 122 is employed to increase the work function of the ITO layer 12.

The plasma treatment 120 modifies the work function to be a desired value by controlling a flow ratio of the first reactive gas 121 to the second reactive gas 122. In order to prevent plasma reaction from over excitation, the mixing gas can further comprise an inactive gas 123. The first reactive gas 121 is a nitrogen-containing gas, such as $N_2$, $NH_3$ or $N_2O$. The second reactive gas 122 is an oxygen-containing gas, such as $O_2$ or $NO_2$. The inactive gas 123 is a noble gas, such as argon. In this embodiment, representative $N_2$ gas 121, $O_2$ gas 122 and Ar gas 123 are illustrated. The plasma treatment 120 can be carried out in a parallel-type plasma system. The operational conditions of the plasma treatment 120 may comprise an RF power of 50~600 W, a process pressure of 1~10 mTorr and a process time of 10~600 sec. It is noted that embodiments of the plasma treatment 120 employ a nitrogen-containing gas to improve workplace safety.

An organic layer 20 is then formed on the modified ITO layer 12' by, for example, vacuum evaporation. The organic layer 20 can comprise a hole transport layer 14, an organic emission layer 16 and a electron transport layer 18, wherein the hole transport layer 14 is adjacent to the modified ITO layer 12'. In this embodiment, the hole transport layer 14 can be an NPB (4-4'-bis[N-(1-naphthyl)-N-phenylamino]-biphenyl) layer with a HOMO (highest occupied molecular orbital) energy level of about 5.4 eV.

A conductive layer 22 serving as a cathode is then formed on the organic layer 20. The conductive layer 22 may be a LiF/Al layer. An OLED 100 is thus obtained.

Figure 2:
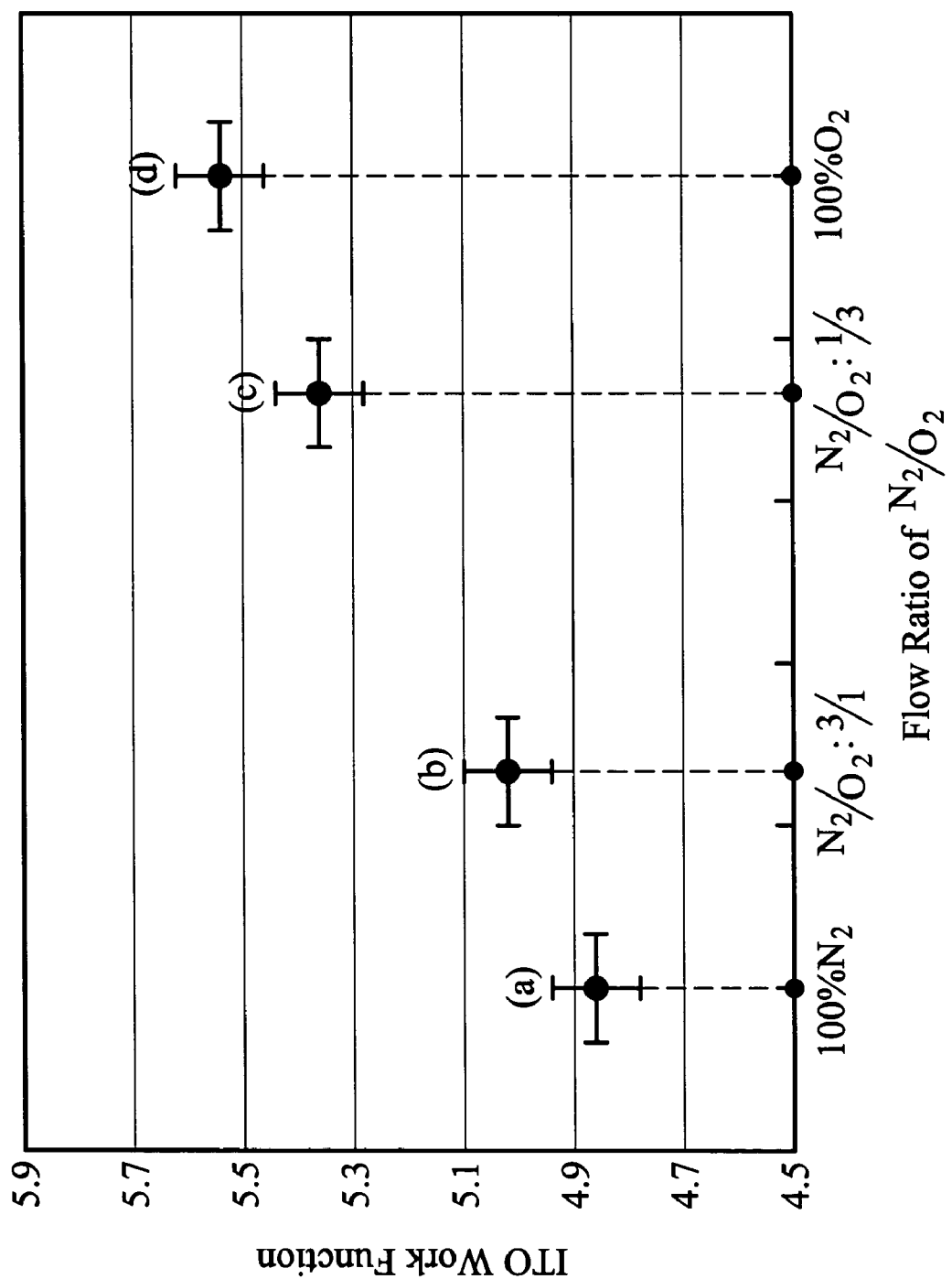
FIG. 2 is a graphical plot of the relationship between ITO work function and flow ratio of $N_2$ to $O_2$ according to an embodiment of a plasma treatment.

An operational example is provided for illustrating an embodiment of forming an OLED 100 having a plasma treated ITO layer 12'. The operational conditions of the plasma treatment used in the example comprise an RF power of about 500 W, a process pressure of about 1 mTorr and a process time of about 25 sec. FIG. 2 shows the ITO work function of an embodiment of an ITO layer treated at different $N_2/O_2$ flow ratios. Point (a) of FIG. 2 shows the ITO work function to be about 4.8 eV when performing a 100% $N_2$ plasma treatment. Point (b) shows the ITO work function to be about 5.0 eV when performing a plasma treatment of $N_2/O_2$ flow ratio of 3/1. Point (c) shows the ITO work function to be about 5.4 eV when performing a plasma treatment of $N_2/O_2$ flow ratio of 1/3. Point (d) shows the ITO work function to be about 5.6 eV when performing a 100% $O_2$ plasma treatment. Referring to FIG. 2, the relationship among these points (a)-(d) is approximately a linear function.

Figure 3:
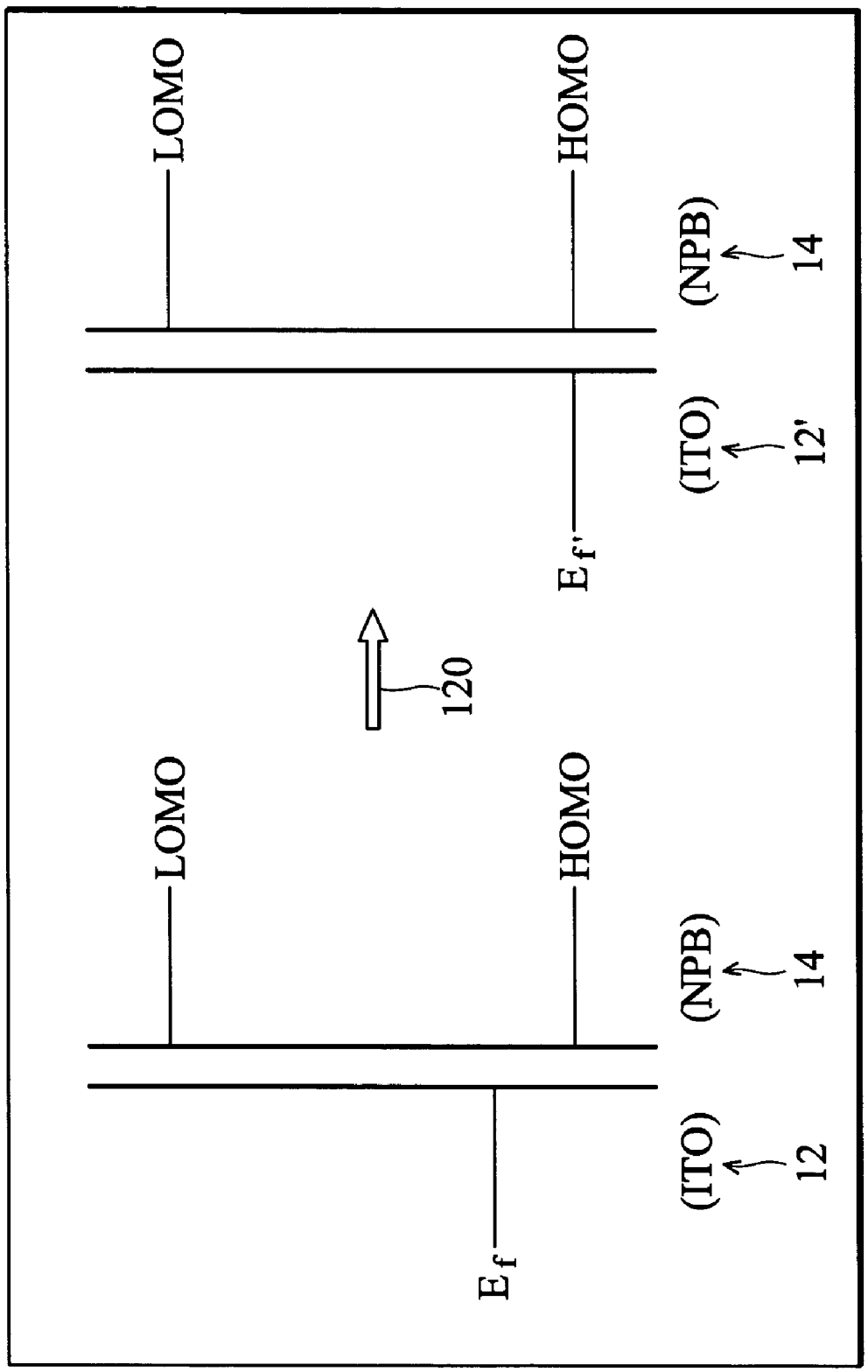
FIG. 3 shows the change in ITO work function of an embodiment of an OLED when subsequent to performance of an embodiment of a plasma treatment.

Accordingly, the plasma treatment 120 can control a flow ratio of the nitrogen gas 121 to the oxygen gas 122 to bring the surface work function of the ITO layer 12' to a desired value. FIG. 3 shows the change in ITO work function of an embodiment of an OLED when subsequent to performance of an embodiment of a plasma treatment. In this embodiment, the hole transport layer 14 employs an NPB layer 14 with a HOMO energy level of 5.4 eV. By performing a plasma treatment of $N_2/O_2$ flow ratio of 1/3, the ITO layer 12 with a surface work function ($E_f$) of 4.9 eV is transformed into the modified ITO layer 12' with a modified surface work function ($E_{f'}$) of 5.4 eV. The modified surface work function of the ITO layer 12' can thus be precisely matched with the HOMO energy level of the NPB layer 14.

The following experimental data are provided for better understanding of an embodiment of an OLED emitting green light having better emission and energy efficiency than provided by the conventional technology. The compositions of the OLED used in the experiment comprise an anode (75 nm) of ITO, a hole transport layer (150 nm) of NPB, an emission layer (37.5 nm) of $Alq_3$ doped with 1% C545T, an electron transport layer (37.5 nm) of $Alq_3$ and a cathode of LiF(1 nm)/Al(200 nm).

Figure 4:
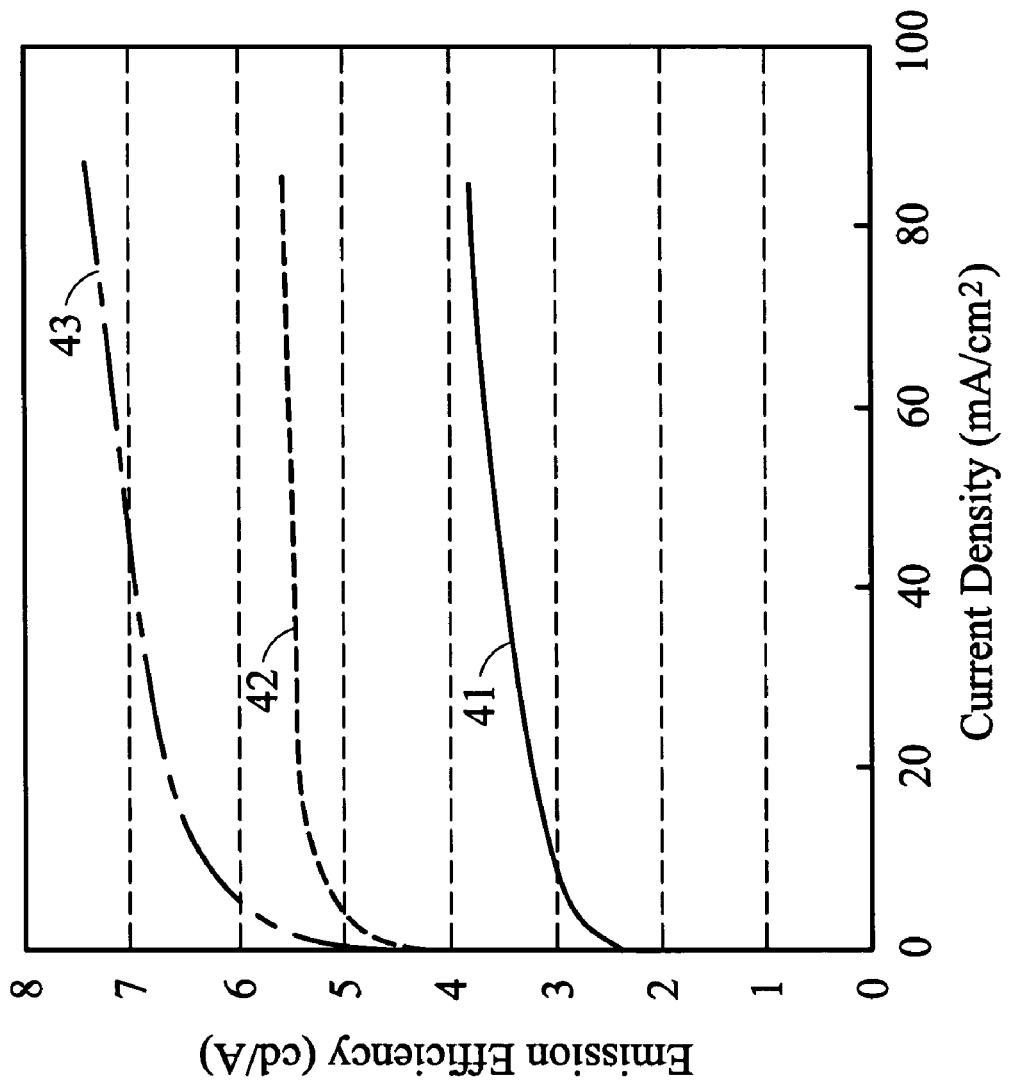
FIG. 4 is a plot of emission efficiency as a function of current density for an embodiment of an OLED according to an embodiment of a plasma treatment, compared to conventional OLEDs.
Figure 5:
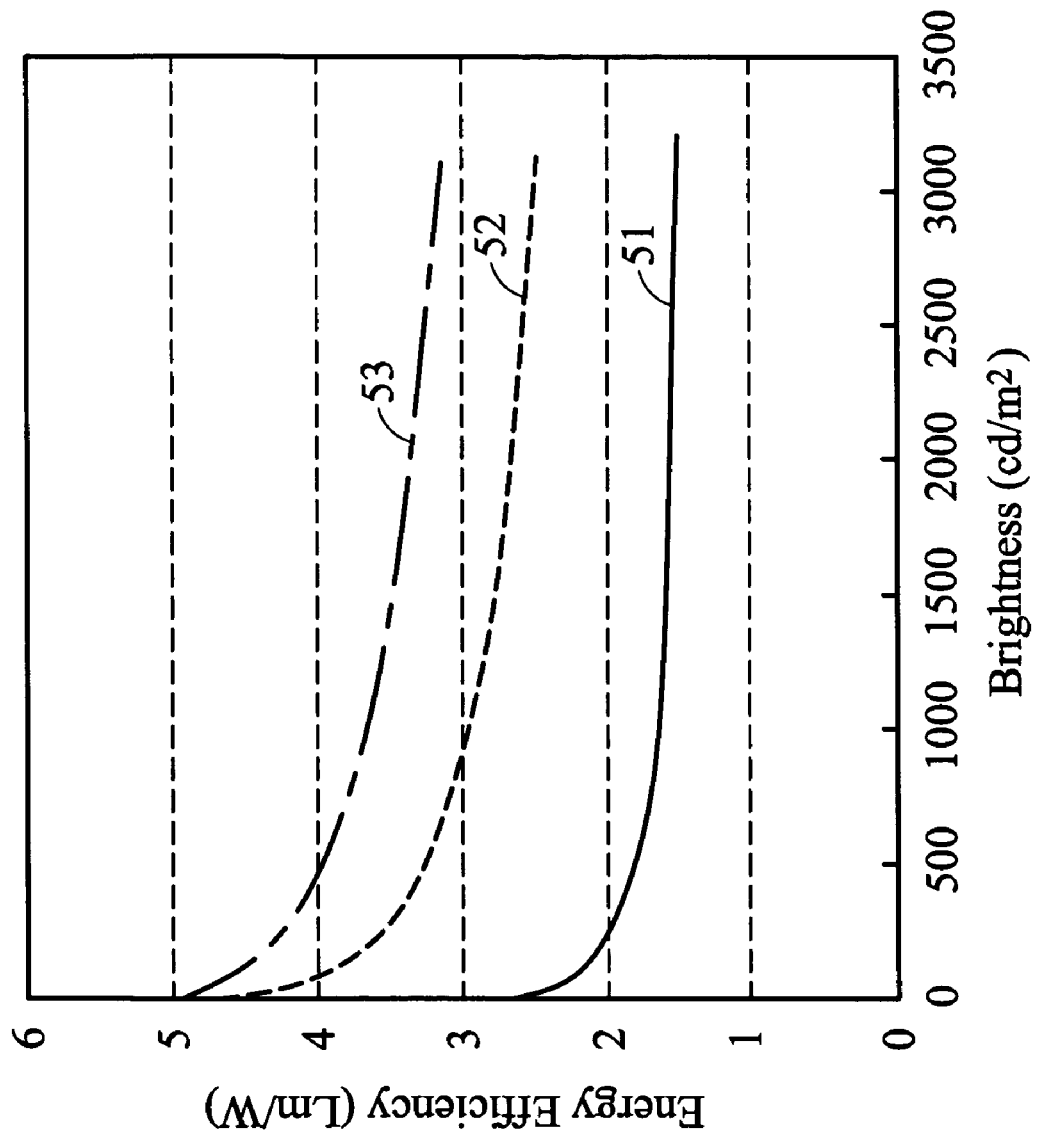
FIG. 5 is a plot of energy efficiency as a function of brightness for an embodiment of an OLED according to an embodiment of a plasma treatment, compared to conventional OLEDs.

FIG. 4 is a plot of emission efficiency as a function of current density for an embodiment of an OLED according to an embodiment of a plasma treatment, compared to conventional OLEDs. FIG. 5 is a plot of energy efficiency as a function of brightness for an embodiment of an OLED according to an embodiment of a plasma treatment, compared to conventional OLEDs. Curves 41 and 51 denote conventional OLEDs having untreated ITO. Curves 42 and 52 denote the conventional OLEDs having $O_2$ plasma treated ITO. Curves 43 and 53 denote embodiments of OLEDs having ITO treated by a $N_2/O_2$ plasma treatment with flow ratio of 1/3. Since the surface work function of the ITO layer is equal or approximately to the HOMO energy level of the NPB layer, the invention provides better emission and energy efficiency than the conventional technology.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of modifying a work function of a conductor surface, comprising:
   providing a conductive layer, wherein a surface of the conductive layer comprises a work function;
   performing a plasma treatment on the conductive layer, wherein the plasma treatment employs a mixing gas comprising a first reactive gas for decreasing the work function and a second reactive gas for increasing the work function; and
   controlling a flow ratio of the first reactive gas to the second reactive gas to modify the work function,
   wherein the first reactive gas is a nitrogen-containing gas and the second reactive gas is an oxygen-containing gas.

2. The method according to claim 1, wherein the conductive layer is an indium-containing oxide layer comprising indium-tin-oxide or indium-zinc-oxide.

3. The method according to claim 2, wherein conditions of the plasma treatment comprise an RF power of 50~600 W, a process pressure of 1~10 mTorr and a process time of 10~600 sec.

4. The method according to claim 1, wherein the conductive layer comprises a metal or an alloy.

5. The method according to claim 1, wherein the nitrogen-containing gas is $N_2$, $NH_3$ or $N_2O$.

6. The method according to claim 1, wherein the oxygen-containing gas is $O_2$ or $NO_2$.

7. The method according to claim 1, wherein the mixing gas comprises an inactive gas.

8. The method according to claim 1, wherein the flow ratio of the first reactive gas to the second reactive gas 1:3.

9. A method of forming an organic light emitting device, comprising:
providing a first conductive layer with a work function;
performing a plasma treatment on the first conductive layer to modify the work function, so that a surface of the first conductive layer comprises a modified work function;
forming an organic layer on the first conductive layer, wherein the organic layer comprises a hole transport layer with a HOMO (highest occupied molecular orbital) energy level adjacent to the first conductive layer; and
forming a second conductive layer on the organic layer;
wherein the plasma treatment employs a mixing gas comprising a first reactive gas for decreasing the work function and a second reactive gas for increasing the work function, and controls a flow ratio of the first reactive gas to the second reactive gas to make the modified work function equal or approximate to the HOMO energy level, and the first reactive gas is a nitrogen-containing gas and the second reactive gas is an oxygen-containing gas.

10. The method according to claim 9, wherein the first conductive layer is an indium-tin-oxide or indium-zinc-oxide layer and the hole transport layer comprises NPB.

11. The method according to claim 9, wherein the first conductive layer comprises a metal or an alloy.

12. The method according to claim 9, wherein the nitrogen-containing gas is $N_2$, $NH_3$ or $N_2O$ and the oxygen-containing gas is $O_2$ or $NO_2$.

13. The method according to claim 12, wherein conditions of the plasma treatment comprise an RF power of 50~600 W, a process pressure of 1~10 mTorr and a process time of 10~600 sec.

14. The method according to claim 13, wherein the conditions of the plasma treatment comprise an RF power of 500 W, a process pressure of 1 mTorr, a process time of 25 sec and the flow ratio is 1:3.

15. The method according to claim 9, wherein the mixing gas comprises an inactive gas.

16. The method according to claim 9, wherein the flow ratio of the first reactive gas to the second reactive gas is 1:3.

17. An organic light emitting device, comprising:
a plasma treated conductive layer;
an organic layer formed on the plasma treated conductive layer, wherein the organic layer comprises a hole transport layer with a HOMO (highest occupied molecular orbital) energy level adjacent to the plasma treated conductive layer; and
a conductive layer formed on the organic layer;
wherein the plasma treated conductive layer having a work function is treated with a plasma treatment to modify the work function, so that a surface of the plasma treated conductive layer comprises a modified work function;
wherein the plasma treatment employs a mixing gas comprising a first reactive gas for decreasing the work function and a second reactive gas for increasing the work function, and controls a flow ratio of the first reactive gas to the second reactive gas to make the modified work function equal or approximate to the HOMO energy level, and the first reactive gas is a nitrogen-containing gas and the second reactive gas is an oxygen-containing gas.

18. The device according to claim 17, wherein the plasma treated conductive layer is an indium-tin-oxide or indium-zinc-oxide layer and the hole transport layer comprises NPB.

19. The device according to claim 17, wherein the plasma treated conductive layer comprises a metal or an alloy.

20. The method according to claim 17, wherein the flow ratio of the first reactive gas to the second reactive gas 1:3.

* * * * *